US010734053B2

(12) United States Patent
Ishikawa et al.

(10) Patent No.: US 10,734,053 B2
(45) Date of Patent: Aug. 4, 2020

(54) MAGNETIC MEMORY DEVICE

(71) Applicant: KABUSHIKI KAISHA TOSHIBA, Tokyo (JP)

(72) Inventors: Mizue Ishikawa, Kanagawa (JP); Yushi Kato, Tokyo (JP); Soichi Oikawa, Tokyo (JP); Hiroaki Yoda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/272,372

(22) Filed: Feb. 11, 2019

(65) Prior Publication Data

US 2020/0058338 A1 Feb. 20, 2020

(30) Foreign Application Priority Data

Aug. 20, 2018 (JP) .................................. 2018-154105

(51) Int. Cl.
| | | |
|---|---|---|
| *H01L 43/10* | (2006.01) | |
| *H01L 43/08* | (2006.01) | |
| *G11C 11/16* | (2006.01) | |

(52) U.S. Cl.
CPC ........ *G11C 11/161* (2013.01); *G11C 11/1659* (2013.01); *G11C 11/1673* (2013.01); *G11C 11/1675* (2013.01); *H01L 43/08* (2013.01); *H01L 43/10* (2013.01)

(58) Field of Classification Search
CPC .......... H01L 43/02; H01L 43/08; H01L 43/10
See application file for complete search history.

(56) References Cited

U.S. PATENT DOCUMENTS

| | | | | |
|---|---|---|---|---|
| 2016/0099288 A1* | 4/2016 | Watanabe | ............. | H01L 27/228 257/295 |
| 2016/0180905 A1* | 6/2016 | Kim | ...................... | G11C 11/161 711/125 |
| 2017/0076770 A1 | 3/2017 | Daibou et al. | | |
| 2017/0141158 A1 | 5/2017 | Daibou et al. | | |

FOREIGN PATENT DOCUMENTS

JP 2017-59634 3/2017

OTHER PUBLICATIONS

Ramaswamy et al., "Hf thickness dependence of spin-orbit torques in Hf/CoFeB/MgO heterostructures," Appl. Phys. Lett. (May 19, 2016). 108:202406-1-202406-5.

(Continued)

*Primary Examiner* — Daniel P Shook
(74) *Attorney, Agent, or Firm* — Finnegan, Henderson, Farabow, Garrett & Dunner, L.L.P.

(57) ABSTRACT

According to one embodiment, a magnetic memory device includes a conductive member, a first magnetic layer, a second magnetic layer, and a first nonmagnetic layer. The conductive member includes a first layer. The first layer includes at least one selected from the group consisting of HfN having a NaCl structure, HfN having a fcc structure, and HfC having a NaCl structure. The first magnetic layer is separated from the first layer in a first direction. The second magnetic layer is provided between the first layer and the first magnetic layer. The first nonmagnetic layer is provided between the first magnetic layer and the second magnetic layer.

17 Claims, 9 Drawing Sheets

(56) References Cited

OTHER PUBLICATIONS

Williams, "Electrical properties of hard materials," International Journal of Refractory Metals and Hard Materials (1999), 17:21-26.

Seo et al., "Epitaxial and polycrystalline $HfN_x$ ($0.8 \leq x \leq 1.5$) layers on MgO (001): Film growth and physical properties," J. Appl. Phys. (Apr. 6, 2005), 97:083521-1-083521-9.

Shinkai et al., "Influence of Sputtering Parameters on the Formation Process of High-Quality and Low-Resistivity HfN Thin Film," Jpn. J. Appl. Phys. (Apr. 1999), 38:2097-2102.

Araujo et al., "Cubic HfN Thin Films with Low Resistivity on Si (001) and MgO (001) Substrates," Journal of Electronic Materials (Sep. 16, 2008), 37:1828-31.

* cited by examiner

# MAGNETIC MEMORY DEVICE

CROSS-REFERENCE TO RELATED APPLICATIONS

This application is based upon and claims the benefit of priority from Japanese Patent Application No. 2018-154105, filed on Aug. 20, 2018; the entire contents of which are incorporated herein by reference.

FIELD

Embodiments described herein relate generally to a magnetic memory device.

BACKGROUND

There is a magnetic memory device using a magnetic layer. Stable operations of the magnetic memory device are desirable.

DETAILED DESCRIPTION

Figure 1:
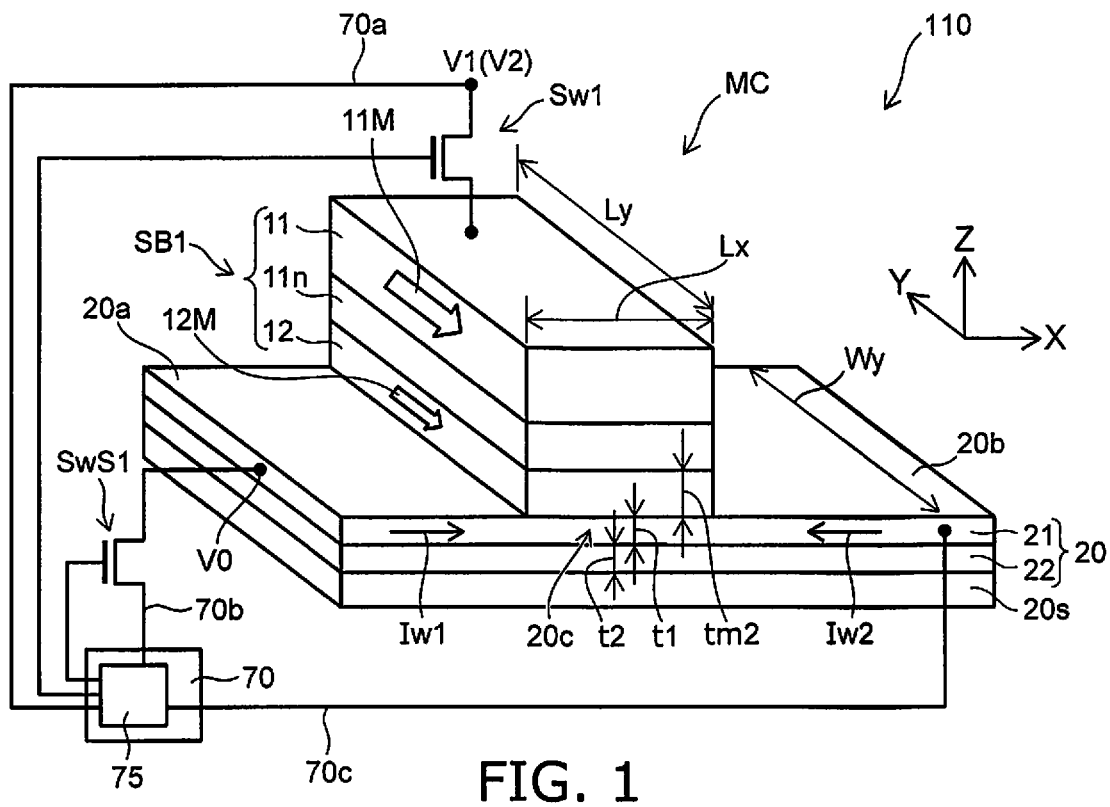
FIG. 1 is a schematic perspective view illustrating a magnetic memory device according to a first embodiment.

According to one embodiment, a magnetic memory device includes a conductive member, a first magnetic layer, a second magnetic layer, and a first nonmagnetic layer. The conductive member includes a first layer. The first layer includes at least one selected from the group consisting of HfN having a NaCl structure, HfN having a fcc structure, and HfC having a NaCl structure. The first magnetic layer is separated from the first layer in a first direction. The second magnetic layer is provided between the first layer and the first magnetic layer. The first nonmagnetic layer is provided between the first magnetic layer and the second magnetic layer.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic perspective view illustrating a magnetic memory device according to a first embodiment.

As shown in FIG. 1, the magnetic memory device 110 according to the embodiment includes a conductive member 20, a first magnetic layer 11, a second magnetic layer 12, and a first nonmagnetic layer 11n. The conductive member 20 includes a first layer 21.

The first layer 21 includes at least one selected from the group consisting of HfN having a NaCl structure, HfN having a fcc structure, and HfC having a NaCl structure. The first layer 21 is conductive.

The first magnetic layer 11 is separated from the first layer 21 in a first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

The second magnetic layer 12 is provided between the first layer 21 and the first magnetic layer 11. The first nonmagnetic layer 11n is provided between the first magnetic layer 11 and the second magnetic layer 12. Other layers may be inserted between the first magnetic layer 11 and the first nonmagnetic layer 11n. Other layers may be inserted between the second magnetic layer 12 and the first nonmagnetic layer 11n.

The first magnetic layer 11 and the second magnetic layer 12 are ferromagnetic. A first stacked body SB1 that includes the first magnetic layer 11, the second magnetic layer 12, and the first nonmagnetic layer 11n corresponds to one memory cell MC.

The electrical resistance of the first stacked body SB1 changes according to the state of the magnetization of the first stacked body SB1. States that have multiple mutually-different electrical resistances correspond to information to be stored.

For example, the first magnetic layer 11 has a first magnetization 11M. The second magnetic layer 12 has a second magnetization 12M. Differences between the states of the orientations of these magnetizations correspond to electrical resistance differences.

In the example, the conductive member 20 includes first to third portions 20a to 20c. The third portion 20c is provided between the first portion 20a and the second portion 20b. A second direction from the first portion 20a toward the second portion 20b crosses the first direction (the Z-axis direction). The second direction is, for example, the X-axis direction. In the example, the first to third portions 20a to 20c are provided in the first layer 21.

The first magnetic layer 11 is separated from the third portion 20c in the first direction (the Z-axis direction). The second magnetic layer 12 is provided between the third portion 20c and the first magnetic layer 11.

For example, the first layer 21 contacts the second magnetic layer 12. The first layer 21 is electrically connected to the second magnetic layer 12.

A controller 70 is provided in the example. The controller 70 may be included in the magnetic memory device 110.

The controller 70 is electrically connected to the first portion 20a and the second portion 20b. In the example, a control circuit 75 is provided in the controller 70. The controller 70 (the control circuit 75) is electrically connected to the first portion 20a via an interconnect 70b. The controller 70 (the control circuit 75) is electrically connected to the second portion 20b via an interconnect 70c. In the example, a switch SwS1 is provided at the interconnect 70b. The switch SwS1 may be provided at the interconnect 70c. The switch SwS1 is, for example, a transistor. The gate of the transistor is electrically connected to the controller 70 (the control circuit 75).

For example, the controller 70 (the control circuit 75) can perform a first operation or a second operation. In the first operation, the controller 70 supplies, to the conductive member 20 (e.g., the first layer 21), a first current Iw1 from the first portion 20a toward the second portion 20b. In the second operation, the controller 70 supplies, to the conductive member 20 (e.g., the first layer 21), a second current Iw2 from the second portion 20b toward the first portion 20a. The electrical resistance of the first stacked body SB1 changes when these currents flow. These currents are, for example, program currents.

For example, the electrical resistance of the first stacked body SB1 after the first operation is different from the electrical resistance of the first stacked body SB1 after the second operation. For example, the orientation of the second magnetization 12M of the second magnetic layer 12 when the first current Iw1 flows is different from the orientation of the second magnetization 12M of the second magnetic layer 12 when the second current Iw2 flows. For example, it is considered that the change of the orientation of the second magnetization 12M is caused by spin orbit coupling generated by the current flowing in the first layer 21.

The angle between the first magnetization 11M and the second magnetization 12M changes due to the change of the orientations of the magnetizations. The electrical resistance changes according to the change of the angle. For example, the change of the electrical resistance is based on a magnetoresistance effect.

The control of the orientations of the magnetizations such as that recited above can be controlled by the potential of the first magnetic layer 11. For example, the potential of the first magnetic layer 11 may be a potential referenced to a potential V0 of the first layer 21. The potential V0 of the first layer 21 may be the potential of the first portion 20a or may be the potential of the second portion 20b.

In the example, the controller 70 (e.g., the control circuit 75) is electrically connected to the first magnetic layer 11 by an interconnect 70a. The characteristics of the first stacked body SB1 can be controlled by the potential of the first magnetic layer 11. For example, the ease of the change of the orientation of the magnetization 12M of the second magnetic layer 12 can be controlled.

In the example, a switch Sw1 is provided at the interconnect 70a. The switch Sw1 is, for example, a transistor. The gate of the transistor is electrically connected to the controller 70 (the control circuit 75).

The controller 70 may perform the first to fourth operations. In the first operation, the controller 70 sets the potential difference between the first portion 20a and the first magnetic layer 11 to a first voltage V1. In the first operation as described above, the controller 70 supplies, to the conductive member 20 (e.g., the first layer 21), the first current Iw1 from the first portion 20a toward the second portion 20b.

In the second operation, the controller 70 sets the potential difference between the first portion 20a and the first magnetic layer 11 to the first voltage V1. In the second operation as described above, the controller 70 supplies, to the conductive member 20 (e.g., the first layer 21), the second current Iw2 from the second portion 20b toward the first portion 20a.

On the other hand, in the third operation, the controller 70 sets the potential difference between the first portion 20a and the first magnetic layer 11 to a second voltage V2 and supplies, to the conductive member 20 (e.g., the first layer 21), the first current Iw1 recited above.

In the fourth operation, the controller 70 sets the potential difference between the first portion 20a and the first magnetic layer 11 to the second voltage V2 and supplies the second current Iw2 recited above to the conductive member 20 (e.g., the first layer 21).

The first voltage V1 is different from the second voltage V2. For example, the polarity of the second voltage V2 may be the reverse of the polarity of the first voltage V1.

The memory cell MC (the first stacked body SB1 including the first magnetic layer 11, the first nonmagnetic layer 11n, and the second magnetic layer 12) is set to a first electrical resistance (e.g., a first memory state) by the first operation recited above. The memory cell MC is set to a second electrical resistance (e.g., a second memory state) by the second operation recited above.

The electrical resistance (e.g., the memory state) of the memory cell MC substantially does not change before and after the third operation. The electrical resistance (e.g., the memory state) of the memory cell MC substantially does not change before and after the fourth operation.

Thus, the storage of the information of the memory cell MC can be controlled by the voltage. The difference between the information to be stored (e.g., "0," "1," etc.) can be controlled by the orientation of the current (the first current Iw1 or the second current Iw2). The "potential difference between the first portion 20a and the first magnetic layer 11" recited above may be the "potential difference between the second portion 20b and the first magnetic layer 11." The "potential difference between the first portion 20a and the first magnetic layer 11" recited above may be the "potential difference between the first portion 20a and the interconnect 70a electrically connected to the first magnetic layer 11."

The change of the electrical resistance of the first stacked body SB1 corresponds to the change of the electrical resistance between the first magnetic layer 11 and the second magnetic layer 12. The change of the electrical resistance of the first stacked body SB1 corresponds to the change of the electrical resistance of the path including, for example, the interconnect 70a electrically connected to the first magnetic layer 11.

In the example, a length Ly along the Y-axis direction of the magnetic layer (one of the first magnetic layer 11 or the second magnetic layer 12) is longer than a length Lx along the X-axis direction of the magnetic layer (the one of the first magnetic layer 11 or the second magnetic layer 12 recited above). For example, the controllability of the magnetization is increased.

For example, the second magnetic layer 12 has a second-direction length aligned with the second direction (e.g., the X-axis direction). For example, the second-direction length substantially corresponds to the length Lx recited above.

The second magnetic layer 12 has a third-direction length along a third direction. The third direction crosses a plane (the Z-X plane) including the first direction and the second direction. For example, the third-direction length substantially corresponds to the length Ly recited above.

The first layer 21 has a first layer width Wy along the third direction. Even in such a case, the third direction crosses a plane (the Z-X plane) including the first direction and the second direction. The first layer width Wy may be the same as or different from the third-direction length (the length Ly recited above).

As described above, the first layer 21 includes at least one selected from the group consisting of HfN having a NaCl structure, HfN having a fcc structure, and HfC having a NaCl structure. The first layer 21 includes, for example, a crystal region. Thereby, for example, the electrical resistivity (the specific resistance) of the first layer 21 can be low.

For example, in the embodiment, the electrical resistivity of the first layer 21 can be lower than the electrical resistivity when the first layer 21 is amorphous. In the embodiment, the electrical resistivity of the first layer 21 can be lower than the electrical resistivity when the first layer 21 includes a microcrystal.

By reducing the electrical resistivity of the first layer 21, the current that flows in the first layer 21 can be stable. For example, the voltage drop that is caused by the resistance can be suppressed. For example, the heat generation that is caused by the resistance can be suppressed. For example, the first current Iw1 and the second current Iw2 recited above can be uniform. For example, the operations of the multiple stacked bodies (the memory cells MC) can be uniform when the multiple stacked bodies are provided in the first layer 21. Stable operations of the multiple memory cells MC are easier to obtain.

Because the electrical resistivity of the first layer 21 is low, for example, the power consumption can be suppressed.

In one example, the electrical resistivity of the first layer 21 is not less than 10 μΩcm and not more than 300 μΩcm. In another example, the electrical resistivity of the first layer 21 is not less than 10 μΩcm and not more than 200 μΩcm. For example, the crystallinity can be improved by heat treatment. Due to the heat treatment, the electrical resistivity of the first layer 21 becomes, for example, not more than 150 μΩcm or not more than 100 μΩcm.

As shown in FIG. 1, a second layer 22 may be further provided in the magnetic memory device 110. The second magnetic layer 12 is provided between the second layer 22 and the first magnetic layer 11. The first layer 21 is provided between the second layer 22 and the second magnetic layer 12.

In the example, the second layer 22 is provided on a substrate 20s. The first layer 21 is provided on the second layer 22. The first stacked body SB1 is provided on the first layer 21. For example, the second layer 22 contacts the first layer 21. The second layer 22 is, for example, a foundation layer.

In one example, the second layer 22 includes at least one selected from the group consisting of Nb, Mo, Ta, W, Eu, ZrN, $ZrC_{0.97}$, $NC_{0.99}$, and $TaC_{0.99}$ when the first layer 21 includes the HfN having the NaCl structure.

In another example, the second layer 22 includes at least one selected from the group consisting of Eu, ZrN, $ZrC_{0.97}$, $NC_{0.99}$, and $TaC_{0.99}$ when the first layer 21 includes the HfN having the NaCl structure.

In another example, the second layer 22 includes at least one selected from the group consisting of V, Mo, W, Eu, TiN, ZrN, TiC, NbN, $NC_{0.99}$, $TaC_{0.99}$, and MgO when the first layer 21 includes the HfC having the NaCl structure.

In another example, the second layer 22 includes at least one selected from the group consisting of Eu, TiN, ZrN, TiC, NbN, $NC_{0.99}$, $TaC_{0.99}$, and MgO when the first layer 21 includes the HfC having the NaCl structure.

For example, the first layer 21 that has good crystallinity is obtained by using such a second layer 22. The size of the grains included in the first layer 21 can be large. The density of the grain boundaries included in the first layer 21 can be reduced. Thereby, for example, the electrical resistivity can be reduced further.

In one example, the lattice mismatch between the first layer 21 and the second layer 22 is 5% or less. For example, the ratio, to the first lattice constant of the first layer 21, of the absolute value of the difference between the first lattice constant and the second lattice constant of the second layer 22 is 5% or less. For example, dislocations that are caused by the lattice mismatch, etc., can be suppressed.

In the embodiment, a thickness t1 of the first layer 21 is, for example, not less than 0.5 nm and not more than 10 nm. A thickness t2 of the second layer 22 is, for example, not less than 0.5 nm and not more than 10 nm. A thickness tm2 of the second magnetic layer 12 is, for example, not less than 0.5 nm and not more than 5 nm. These thicknesses are distances along the Z-axis direction.

An example of measurement results of characteristics of the configuration including the first layer 21 and the first stacked body SB1 will now be described. A first sample SP01 described below has a configuration of a Ta layer (3 nm)/MgO layer (1.1 nm)/CoFeB layer/HfN layer (8 nm). A second sample SP02 has a configuration of a Ta layer (3 nm)/MgO (1.1 nm)/CoFe layer/HfN layer (8 nm). The lengths inside the parentheses recited above each are the thicknesses of the layers. The HfN layer has a NaCl structure. In the CoFeB layer, the composition ratio of Co is 0.4; the composition ratio of Fe is 0.4; and the composition ratio of B is 0.2. The CoFeB layer and the CoFe layer correspond to the second magnetic layer 12. In the experiment, the thicknesses of the CoFeB layer and the CoFe layer (corresponding to the thickness tm2) each are modified.

Figure 2:
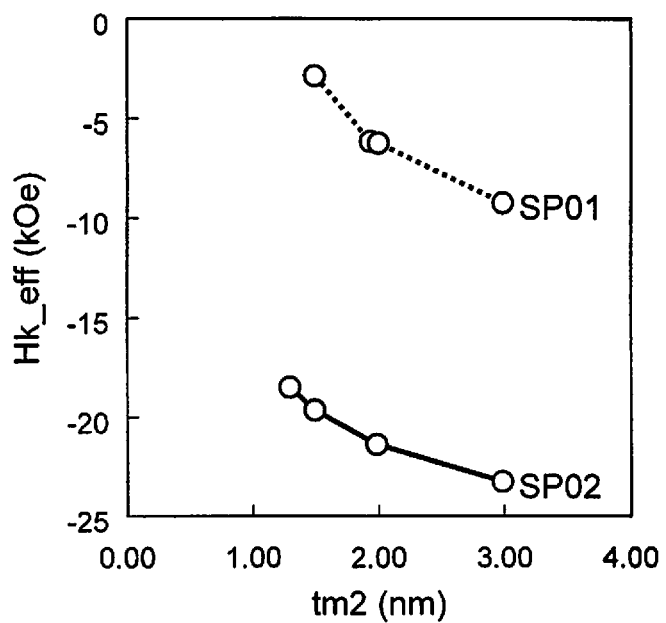
FIG. 2 is a graph illustrating a characteristic of the magnetic memory device.

FIG. 2 is a graph illustrating a characteristic of the magnetic memory device.

The horizontal axis of FIG. 2 corresponds to the thickness tm2 (nm). The vertical axis corresponds to an effective perpendicular anisotropic magnetic field Hk_eff (kOe).

As shown in FIG. 2, in the case of both the first sample SP01 and the second sample SP02, the absolute value of the effective perpendicular anisotropic magnetic field Hk_eff increases as the thickness tm2 increases. In the first sample SP01, the effective perpendicular anisotropic magnetic field Hk_eff is about −9 kOe to −3 kOe. In the second sample SP02, the effective perpendicular anisotropic magnetic field Hk_eff is about −24 kOe to −19 kOe.

Figure 3:
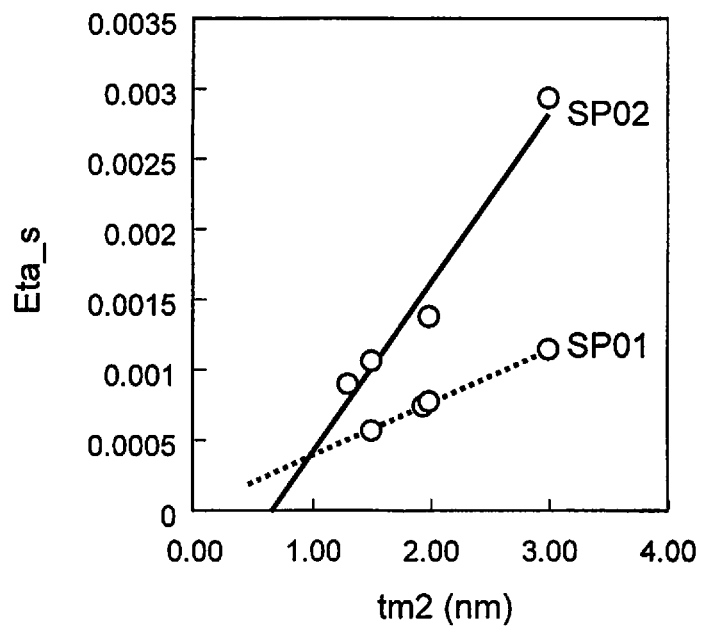
FIG. 3 is a graph illustrating a characteristic of the magnetic memory device.

FIG. 3 is a graph illustrating a characteristic of the magnetic memory device.

The horizontal axis of FIG. 3 corresponds to the thickness tm2 (nm). The vertical axis corresponds to an ellipticity saturation value Eta_s. The ellipticity saturation value Eta_s is a value proportional to the saturation magnetization.

In the second sample SP02 as shown in FIG. 3, a "Dead Layer" having a thickness of about 0.6 nm occurs. On the other hand, in the first sample SP01, a "Dead Layer" substantially does not occur.

Figure 4:
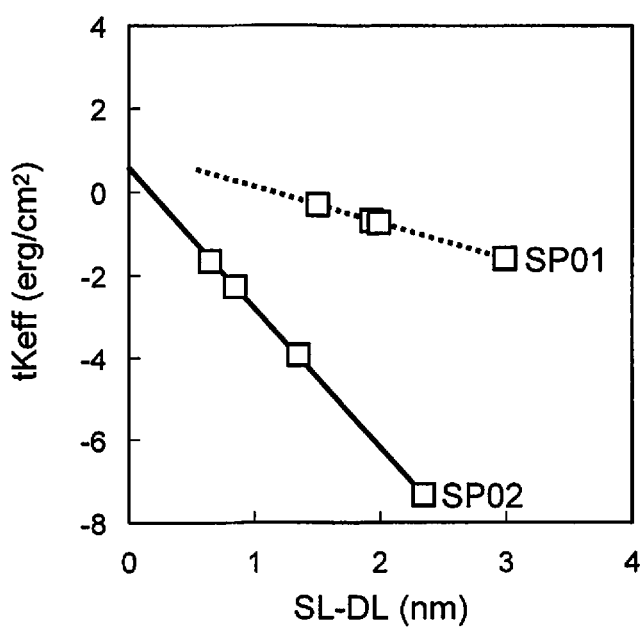
FIG. 4 is a graph illustrating a characteristic of the magnetic memory device.

FIG. 4 is a graph illustrating a characteristic of the magnetic memory device.

The horizontal axis of FIG. 4 corresponds to a thickness "SL-DL" (nm). The thickness "SL-DL" corresponds to the difference between the thickness tm2 (SL) and the thickness "DL" (nm) of the "Dead Layer." The vertical axis is a uniaxial magnetic anisotropy tKeff (erg/cm$^2$).

In the first sample SP01 and the second sample SP02 as shown in FIG. 4, it can be confirmed that the thickness "SL-DL" and the uniaxial magnetic anisotropy tKeff have substantially linear relationships; and the samples are good.

In the first sample SP01, the thickness "DL" of the "Dead Layer" is substantially 0. For the first sample SP01, a saturation magnetization Ms of about 1110 emu/cm$^3$ is derived. For the first sample SP01, an interface magnetic anisotropy Ks of 1.03 erg/cm$^2$ is derived. Good magnetic properties are obtained for the HfN layer having the NaCl structure.

Figure 5:
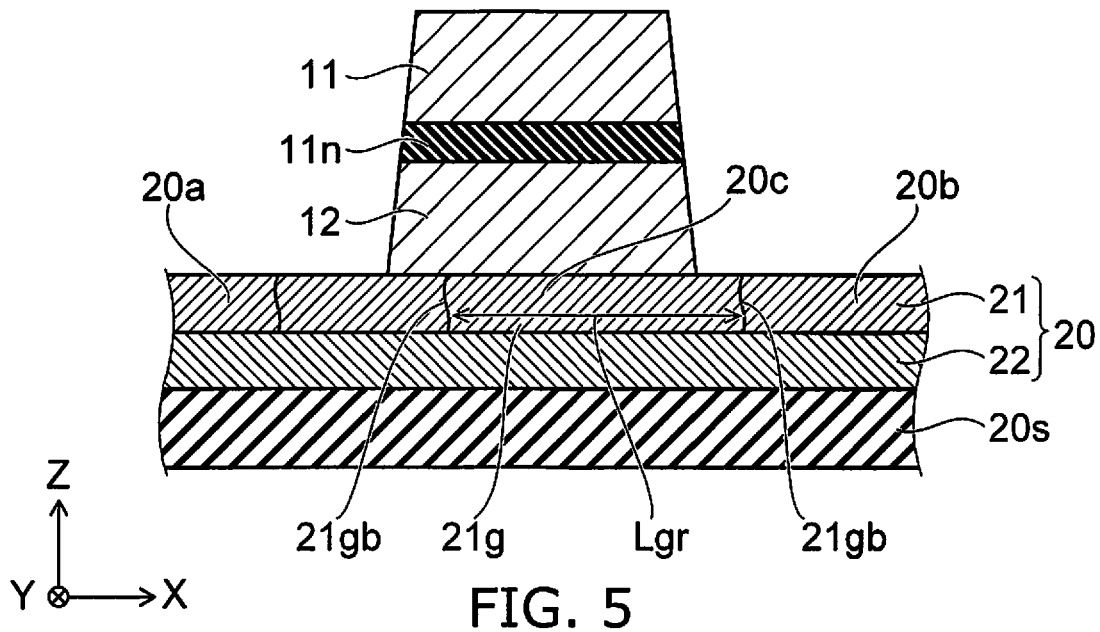
FIG. 5 is a schematic cross-sectional view illustrating the magnetic memory device according to the first embodiment.

FIG. 5 is a schematic cross-sectional view illustrating the magnetic memory device according to the first embodiment.

As shown in FIG. 5, the first layer 21 may include multiple grains 21g (e.g., crystal grains). The size of the multiple grains 21g may be 0.1 times the width of the second magnetic layer 12 or more.

For example, as described above, the second magnetic layer 12 has the second-direction length (the length Lx) along the second direction (e.g., the X-axis direction). In one example, a length Lgr along the second direction of at least one of the multiple grains 21g is 1/10 of the second-direction length (the length Lx) or more. The length Lgr may be ½ of the second-direction length (the length Lx) or more.

The length along the second direction of one of the multiple grains 21g corresponds to the distance along the second direction between multiple grain boundaries 21gb.

The size of one of the multiple grains 21g may be the length in any direction along the X-Y plane. The size of one of the multiple grains 21g may be the length along, for example, the third direction (e.g., the Y-axis direction).

For example, as described above, the second magnetic layer 12 has the third-direction length (the length Ly) aligned with the third direction (a direction crossing a plane including the first direction and the second direction) (referring to FIG. 1). The third direction is, for example, the Y-axis direction. In one example, the length along the third direction (e.g., the Y-axis direction) of at least one of the multiple grains 21g is 1/10 of the third-direction length (the length Ly) or more. The length along the third direction of at least one of the multiple grains 21g may be ½ of the third-direction length (the length Ly) or more.

For example, as described above, the first layer 21 has the first layer width Wy along the third direction (a direction crossing a plane (the Z-X plane) including the first direction and the second direction) (referring to FIG. 1). In one example, the length along the third direction of at least one of the multiple grains 21g is 1/10 of the first layer width Wy or more. The length along the third direction of at least one of the multiple grains 21g may be ½ of the first layer width Wy or more.

In the embodiment, for example, a designated crystal plane of the first layer 21 may be along the X-Y plane. In one example, the <001> direction of at least a portion of the first layer 21 is aligned with the first direction (the Z-axis direction). For example, the absolute value of the angle between the <001> direction and the first direction is 30 degrees or less.

In another example, the <110> direction of at least a portion of the first layer 21 is aligned with the first direction (the Z-axis direction). For example, the absolute value of the angle between the <110> direction and the first direction is 30 degrees or less.

Figure 6:
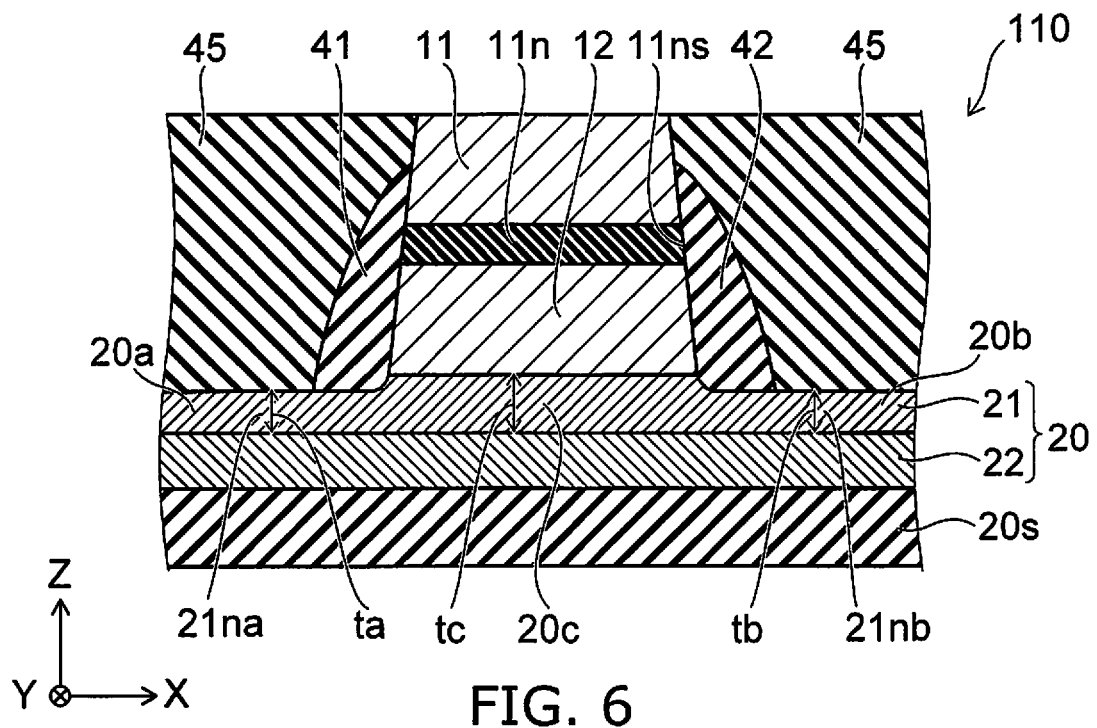
FIG. 6 is a schematic cross-sectional view illustrating the magnetic memory device according to the first embodiment.

FIG. 6 is a schematic cross-sectional view illustrating the magnetic memory device according to the first embodiment.

As shown in FIG. 6, the magnetic memory device 110 may further include a first member 41. A second member 42 and an insulating member 45 are further provided in the example.

The first member 41 includes Hf and a first element. The first element includes at least one selected from the group consisting of oxygen and nitrogen. The second member 42 includes Hf and a second element. The second element includes at least one selected from the group consisting of oxygen and nitrogen. For example, at least one of the first member 41 or the second member 42 includes a compound of the Hf included in the first layer 21. The compound includes at least one selected from the group consisting of an oxide of Hf, a nitride of Hf, and an oxynitride of Hf. The electrical resistances of the first member 41 and the second member 42 are high. The first member 41 and the second member 42 are insulative.

The first nonmagnetic layer 11n has a side surface 11ns. The side surface 11ns crosses a plane (the X-Y plane) perpendicular to the first direction (the Z-axis direction). The first member 41 opposes at least a portion of the side surface 11ns. For example, the side surface 11ns is covered with the first member 41. For example, electrical contact between the first magnetic layer 11 and the second magnetic layer 12 can be suppressed.

The first member 41 may further oppose the second magnetic layer 12 in a direction along the perpendicular plane (the X-Y plane) recited above. For example, the first member 41 may further oppose the first magnetic layer 11 in the direction along the perpendicular plane (the X-Y plane) recited above. Electrical shorts via the side surface 11ns can be suppressed.

For example, at least a portion of the first nonmagnetic layer 11n is provided between the first member 41 and the second member 42 in a direction crossing the first direction (the Z-axis direction) (one direction in the X-Y plane, and in the example, the X-axis direction). For example, the second magnetic layer 12 is provided between the first member 41 and the second member 42.

For example, when the first layer 21 includes HfC, the first member 41 may include Hf and carbon. In such a case as well, the first nonmagnetic layer 11n has the side surface 11ns crossing the plane perpendicular to the first direction. For example, the first member 41 opposes at least a portion of the side surface 11ns.

For example, the first member 41 and the second member 42 may be provided between multiple regions of the insulating member 45 in the X-axis direction.

For example, the first stacked body SB1 can be formed by forming, on the first layer 21, a stacked film including a film used to form the second magnetic layer 12, a film used to form the first nonmagnetic layer 11n, and a film used to form the first magnetic layer 11, and by removing a portion of the stacked film. In the removal, a portion (the front surface portion) of the first layer 21 also is removed. The first member 41 and the second member 42 may be formed at this time by the Hf included in the first layer 21 adhering to the sidewall of the first stacked body SB1. HfN and HfC oxidize easily. Therefore, the Hf that adheres to the sidewall of the first stacked body SB1 becomes a compound; and a high resistance is obtained. The compound includes, for example, at least one selected from the group consisting of an oxide of Hf, a nitride of Hf, and an oxynitride of Hf. A high insulative property is obtained at the side surface of the first stacked body SB1.

At this time, the thickness of a portion of the first layer 21 becomes thin. For example, as shown in FIG. 6, the first layer 21 may include non-overlap regions (regions 21*na* and 21*nb*) not overlapping the second magnetic layer 12 in the first direction (the Z-axis direction). A thickness tc along the first direction (the Z-axis direction) of the third portion 20*c* (the overlap region) is thicker than the thickness (the thickness ta or the thickness tb) along the first direction of the non-overlap region.

In the magnetic memory device 110, at least a portion of the second layer 22 may be amorphous. For example, the first layer 21 that has good crystallinity is obtained on the amorphous second layer 22. The amorphous second layer 22 may include, for example, boron. The amorphous second layer 22 may include, for example, a boride. The boride includes, for example, boron and at least one selected from the group consisting of Hf, Ta, and W.

Several other examples of the magnetic memory device according to the embodiment will now be described. The portions that are different from those of the magnetic memory device 110 will be described.

Figure 7:
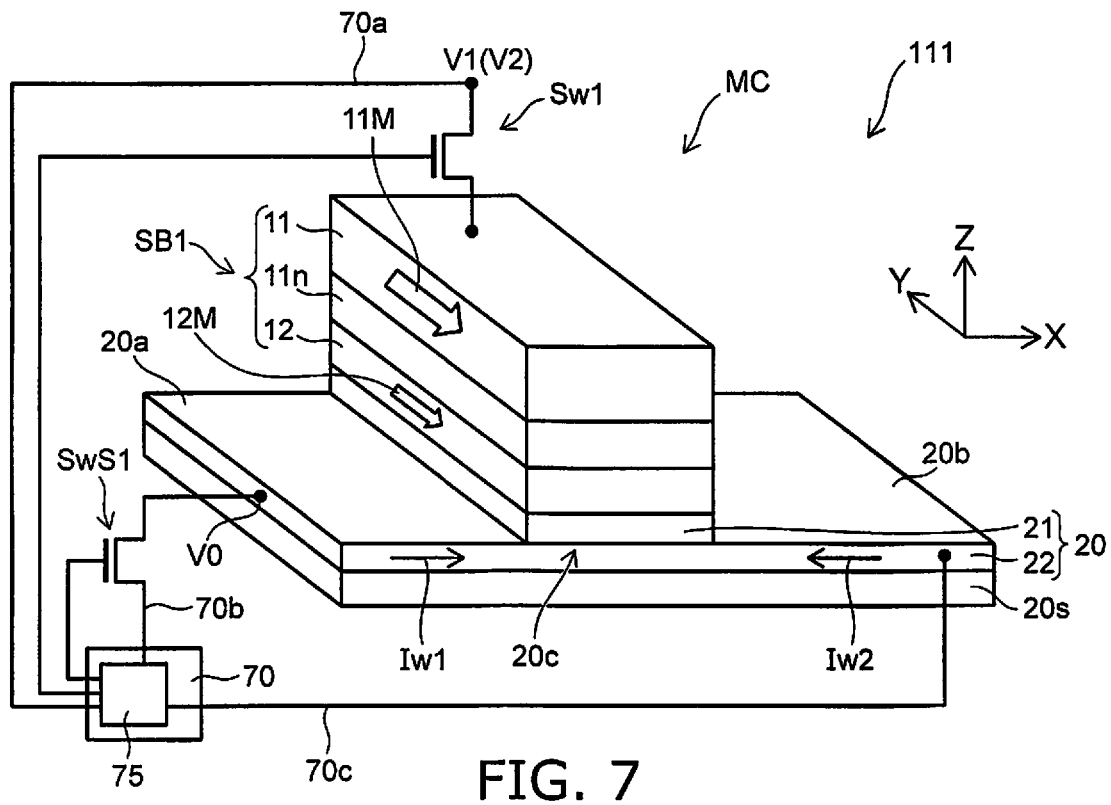
FIG. 7 is a schematic perspective view illustrating a magnetic memory device according to the first embodiment.

FIG. 7 is a schematic perspective view illustrating a magnetic memory device according to the first embodiment.

As shown in FIG. 7, the magnetic memory device 111 according to the embodiment also includes the conductive member 20, the first magnetic layer 11, the second magnetic layer 12, and the first nonmagnetic layer 11*n*. The conductive member 20 includes the first layer 21. In the magnetic memory device 111 of the example, the first layer 21 is provided in a portion overlapping the second magnetic layer 12 in the Z-axis direction. For example, the first layer 21 substantially does not include a portion not overlapping the second magnetic layer 12 in the Z-axis direction. In the magnetic memory device 111 as well, more stable operations are obtained because the electrical resistivity of the first layer 21 can be low.

In the example, the first to third portions 20*a* to 20*c* of the conductive member 20 are provided in the second layer 22. A current (the first current Iw1 or the second current Iw2) is supplied to the second layer 22. In the example, the second layer 22 is conductive.

Figure 8:
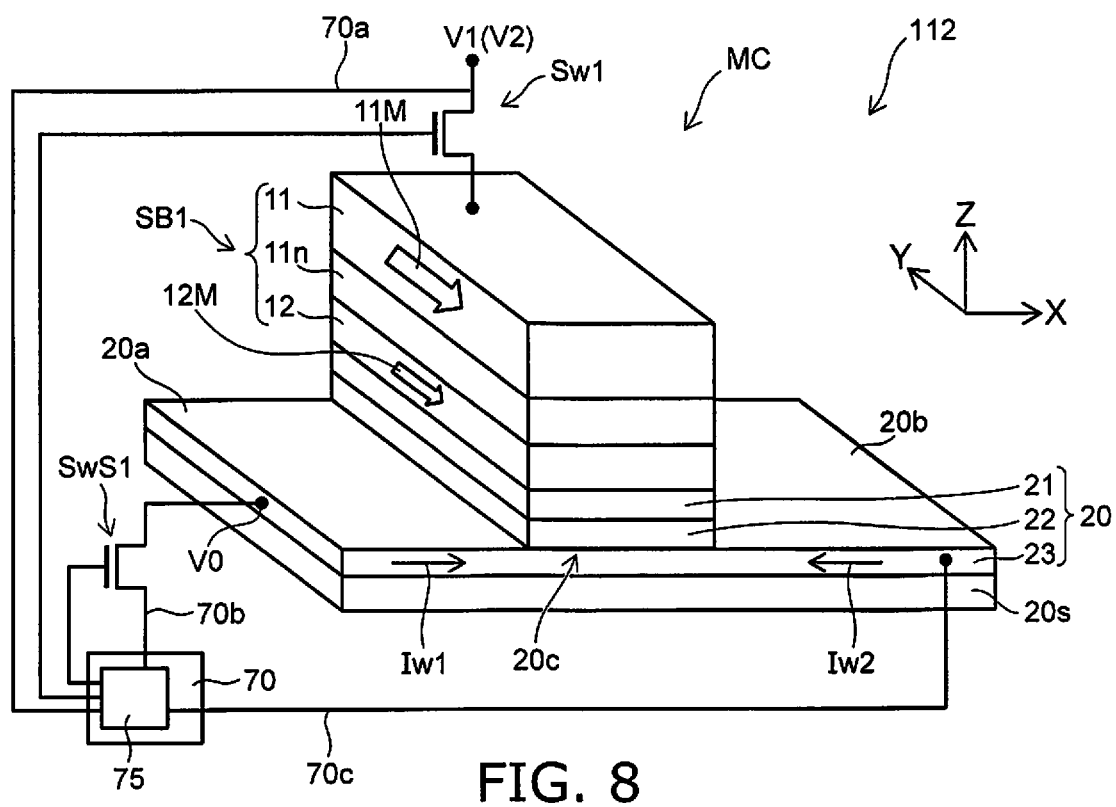
FIG. 8 is a schematic perspective view illustrating a magnetic memory device according to the first embodiment.

FIG. 8 is a schematic perspective view illustrating a magnetic memory device according to the first embodiment.

As shown in FIG. 8, the magnetic memory device 112 according to the embodiment also includes the conductive member 20, the first magnetic layer 11, the second magnetic layer 12, and the first nonmagnetic layer 11*n*. The conductive member 20 further includes a third layer 23 in addition to the first layer 21 and the second layer 22. The third layer 23 is conductive.

The first layer 21 is provided between the third layer 23 and the second magnetic layer 12. The second layer 22 is provided between the third layer 23 and the first layer 21. In the example, the first layer 21 and the second layer 22 are provided in a portion overlapping the second magnetic layer 12 in the Z-axis direction. For example, the first layer 21 and the second layer 22 substantially do not include portions not overlapping the second magnetic layer 12 in the Z-axis direction. In the magnetic memory device 112 as well, more stable operations are obtained because the electrical resistivity of the first layer 21 can be low.

In the example, the first to third portions 20*a* to 20*c* of the conductive member 20 are provided in the third layer 23. A current (the first current Iw1 or the second current Iw2) is supplied to the third layer 23.

In the case where the third layer 23 is provided, the first layer 21 may include a portion not overlapping the second magnetic layer 12 in the Z-axis direction. In the case where the third layer 23 is provided, the second layer 22 may include a portion not overlapping the second magnetic layer 12 in the Z-axis direction.

The third layer 23 includes, for example, at least one selected from the group consisting of Cu, Al, Hf, Ta, W, Re, Ir, Pt, and Au. By using the third layer 23 having a high conductivity, the electrical resistivity of the conductive member 20 can be even lower.

In one example in which the third layer 23 is provided, the second layer 22 is conductive. In another example in which the third layer 23 is provided, the resistivity of the second layer 22 may be high. In such a case, by using a thin second layer 22, for example, the electrical connection between the third layer 23 and the first layer 21 is performed by a tunneling current.

Figure 9:
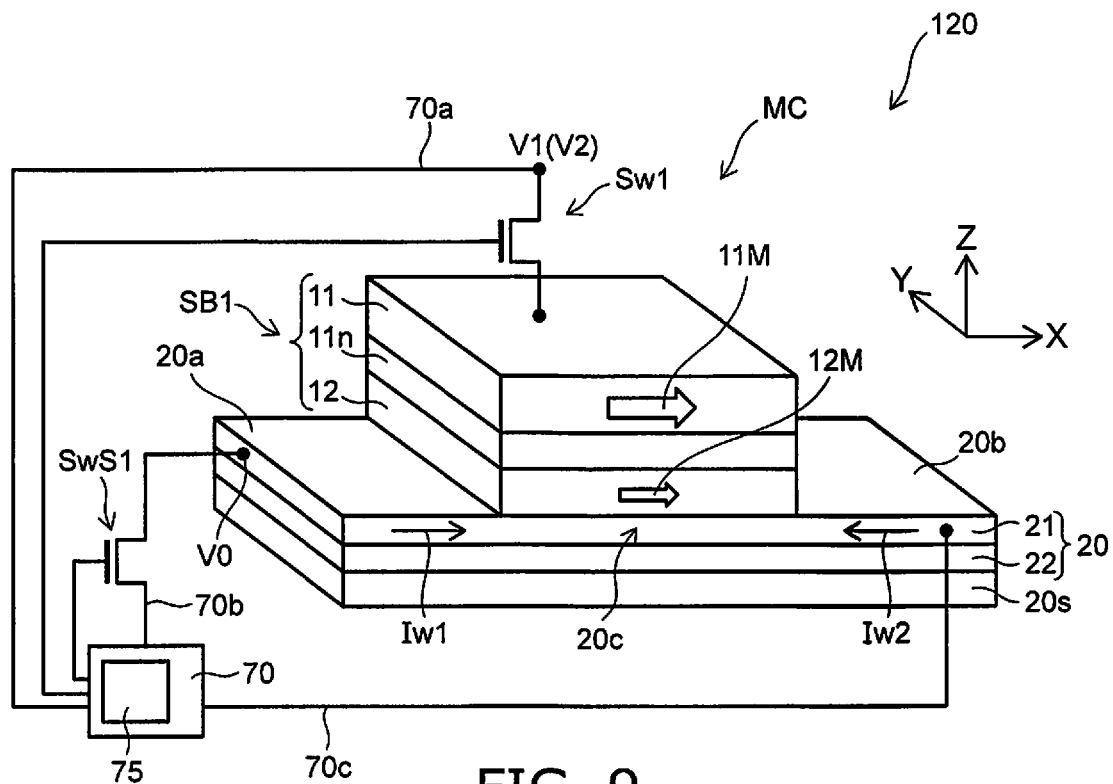
FIG. 9 is a schematic perspective view illustrating a magnetic memory device according to the first embodiment.

FIG. 9 is a schematic perspective view illustrating a magnetic memory device according to the first embodiment.

As shown in FIG. 9, the magnetic memory device 120 according to the embodiment also includes the first layer 21, the first magnetic layer 11, the second magnetic layer 12, the first nonmagnetic layer 11*n*, and the controller 70. The directions of the magnetizations of the magnetic layers of the magnetic memory device 120 are different from those of the magnetic memory device 110. Otherwise, the configuration of the magnetic memory device 120 is similar to the configuration of the magnetic memory device 110.

In the magnetic memory device 120, the first magnetization 11M of the first magnetic layer 11 is aligned with the second direction (e.g., the X-axis direction). For example, the second magnetization 12M of the second magnetic layer 12 is substantially aligned with the second direction.

In the magnetic memory device 120, for example, a direct switching mode operation is performed. The rate of the magnetization reversal in the direct switching mode is higher than the rate of the magnetization reversal in a precessional switching mode. In the direct switching mode, precession does not accompany the magnetization reversal. Therefore, the magnetization reversal rate is independent of a damping constant α. A high magnetization reversal rate is obtained in the magnetic memory device 120.

In the magnetic memory device 120, for example, the length in one direction (the length in the major-axis direction) of the first magnetic layer 11 is longer than the length in another one direction (the minor-axis direction length) of the first magnetic layer 11. For example, the length (the length in the major-axis direction) along the second direction (e.g., the X-axis direction) of the first magnetic layer 11 is longer than the length (the minor-axis direction length) along the third direction (e.g., the Y-axis direction) of the first magnetic layer 11. For example, the first magnetization 11M of the first magnetic layer 11 is easily aligned with the second direction due to the shape anisotropy.

In the magnetic memory device 120, for example, the major-axis direction of the first magnetic layer 11 is aligned with the second direction. The major-axis direction of the first magnetic layer 11 may be tilted with respect to the second direction. For example, the angle (the absolute value) between the major-axis direction of the first magnetic layer 11 and the second direction (a direction corresponding to the direction of the current flowing through the first layer 21) is, for example, not less than 0 degrees but less than 30 degrees. By such a configuration, for example, a high programming speed is obtained.

Figure 10:
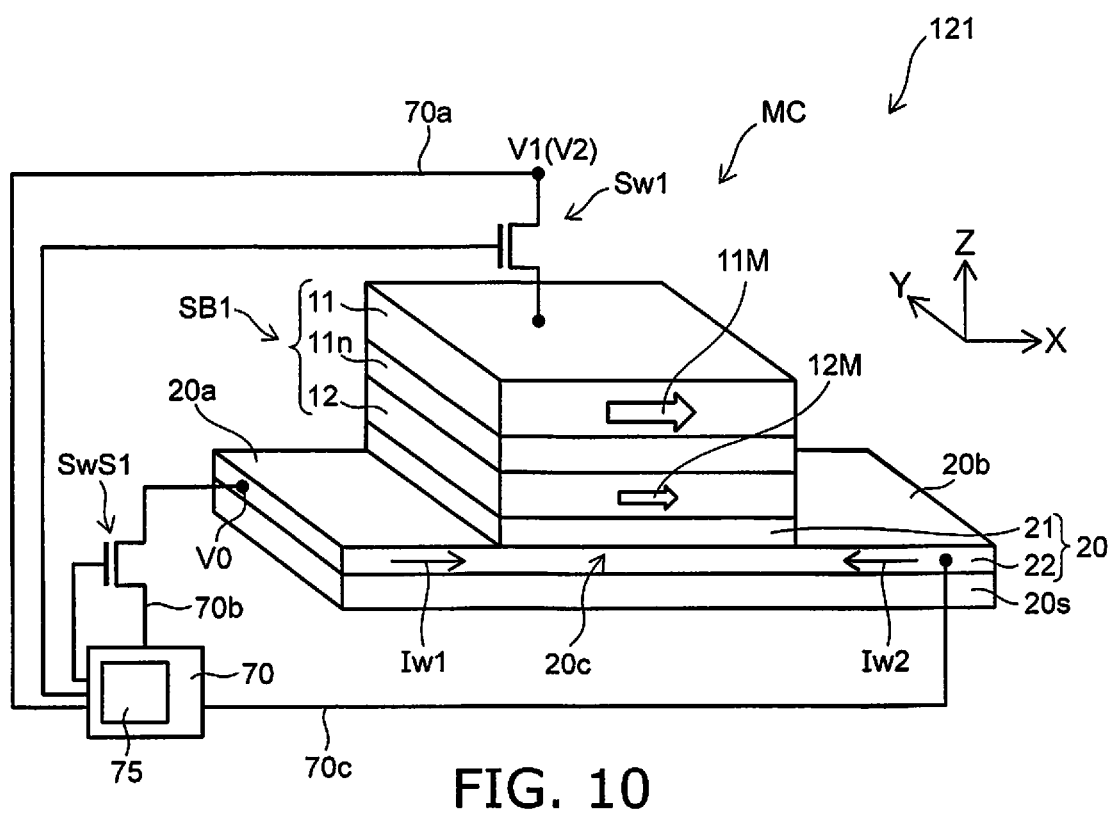
FIG. 10 is a schematic perspective view illustrating a magnetic memory device according to the first embodiment.

FIG. 10 is a schematic perspective view illustrating a magnetic memory device according to the first embodiment.

As shown in FIG. 10, in the magnetic memory device 121 according to the embodiment as well, the first layer 21 is provided in a portion overlapping the second magnetic layer 12 in the Z-axis direction in the example. For example, the first layer 21 substantially does not include a portion not overlapping the second magnetic layer 12 in the Z-axis direction. Even in such a case, more stable operations are obtained because the electrical resistivity of the first layer 21 can be low.

In the example, the first to third portions 20a to 20c of the conductive member 20 are provided in the second layer 22. A current (the first current Iw1 or the second current Iw2) is supplied to the second layer 22. In the example, the second layer 22 is conductive.

Figure 11:
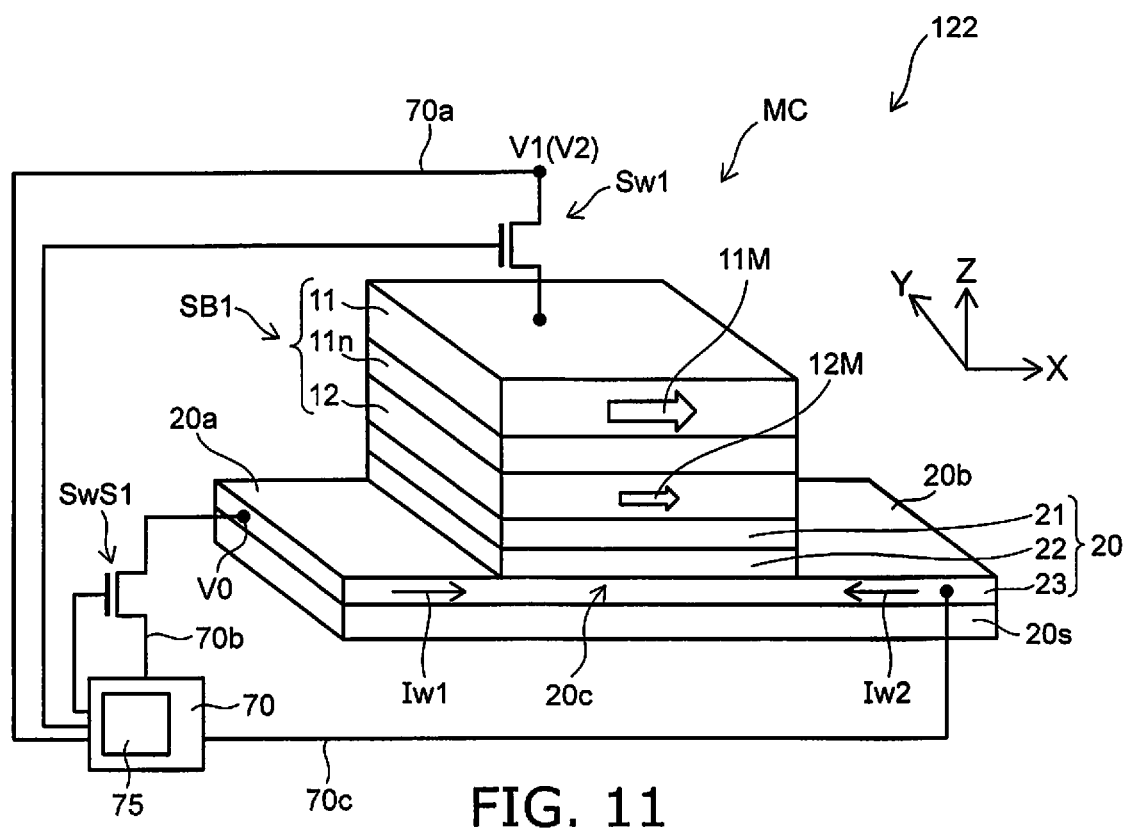
FIG. 11 is a schematic perspective view illustrating a magnetic memory device according to the first embodiment.

FIG. 11 is a schematic perspective view illustrating a magnetic memory device according to the first embodiment.

In the magnetic memory device 122 according to the embodiment as shown in FIG. 11, the conductive member 20 further includes the third layer 23 in addition to the first layer 21 and the second layer 22. The third layer 23 is conductive. In the magnetic memory device 122 as well, more stable operations are obtained because the electrical resistivity of the first layer 21 can be low. For example, the first to third portions 20a to 20c of the conductive member 20 are provided in the third layer 23. A current (the first current Iw1 or the second current Iw2) is supplied to the third layer 23.

Second Embodiment

Figure 12:
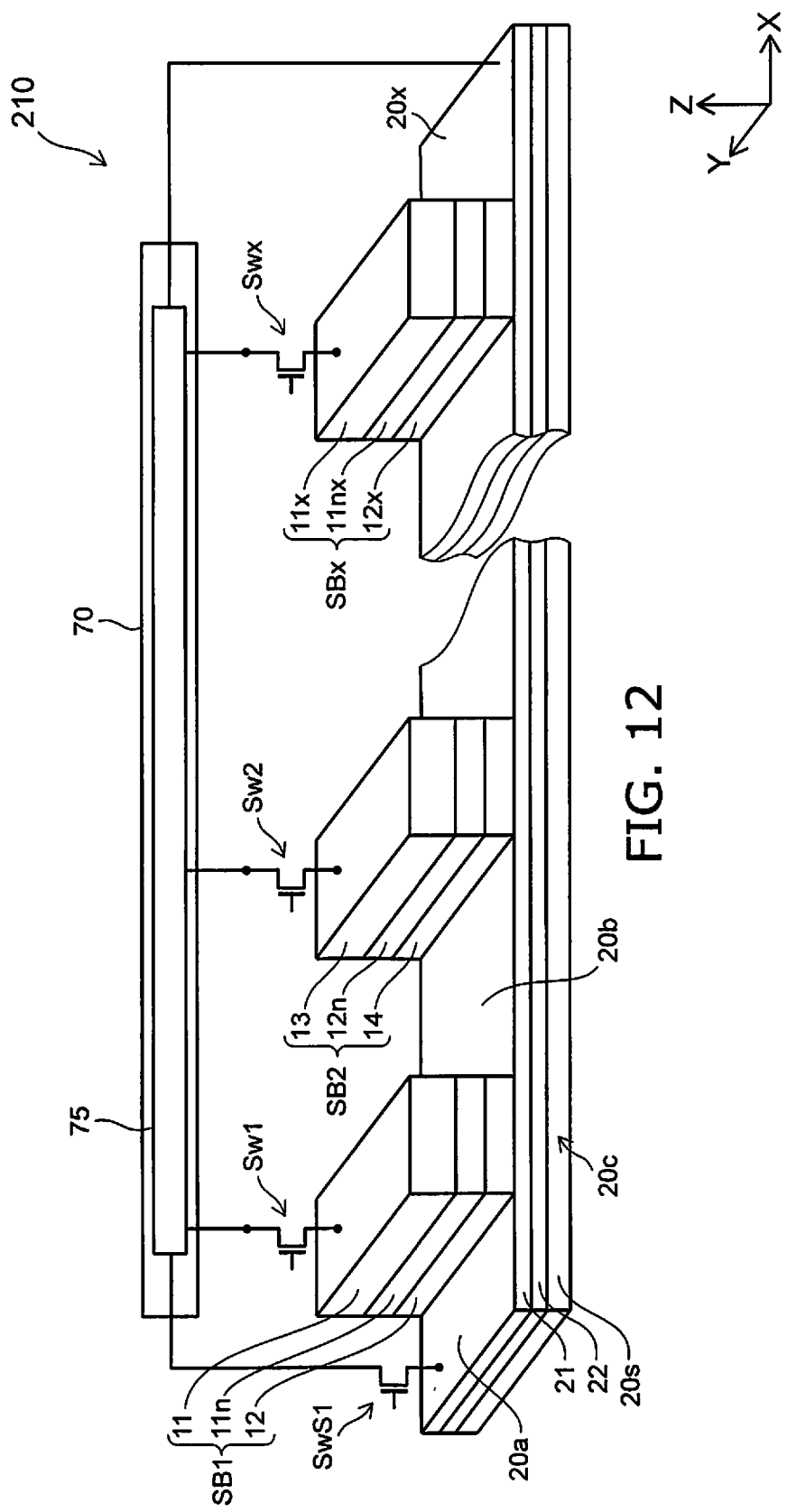
FIG. 12 is a schematic perspective view illustrating a magnetic memory device according to a second embodiment.

FIG. 12 is a schematic perspective view illustrating a magnetic memory device according to a second embodiment.

As shown in FIG. 12, multiple stacked bodies (the first stacked body SB1, a second stacked body SB2, a stacked body SBx, etc.) are provided in the magnetic memory device 210 according to the embodiment. Also, multiple switches (the switch Sw1, a switch Sw2, a switch Swx, etc.) are provided. Otherwise, the configuration of the magnetic memory device 210 is similar to that of the magnetic memory device 110.

The multiple stacked bodies are arranged along the first layer 21. For example, the second stacked body SB2 includes a third magnetic layer 13, a fourth magnetic layer 14, and a second nonmagnetic layer 12n. The third magnetic layer 13 is separated in the first direction (the Z-axis direction) from a portion of the first layer 21. The fourth magnetic layer 14 is provided between the third magnetic layer 13 and the portion of the first layer 21. The second nonmagnetic layer 12n is provided between the third magnetic layer 13 and the fourth magnetic layer 14.

For example, the third magnetic layer 13 is separated from the first magnetic layer 11 in the second direction (e.g., the X-axis direction). The fourth magnetic layer 14 is separated from the second magnetic layer 12 in the second direction. The second nonmagnetic layer 12n is separated from the first nonmagnetic layer 11n in the second direction.

For example, the stacked body SBx includes a magnetic layer 11x, a magnetic layer 12x, and a nonmagnetic layer 11nx. The magnetic layer 11x is separated in the first direction (the Z-axis direction) from another portion of the first layer 21. The magnetic layer 12x is provided between the magnetic layer 11x and the other portion of the first layer 21. The nonmagnetic layer 11nx is provided between the magnetic layer 11x and the magnetic layer 12x.

For example, the material and the configuration of the third magnetic layer 13 are the same as the material and the configuration of the first magnetic layer 11. For example, the material and the configuration of the fourth magnetic layer 14 are the same as the material and the configuration of the second magnetic layer 12. For example, the material and the configuration of the second nonmagnetic layer 12n are the same as the material and the configuration of the first nonmagnetic layer 11n.

The multiple stacked bodies function as the multiple memory cells MC.

The switch Sw1 is electrically connected to the first magnetic layer 11. The switch Sw2 is electrically connected to the third magnetic layer 13. The switch Swx is electrically connected to the magnetic layer 11x. These switches are electrically connected to the control circuit 75 of the controller 70. Any of the multiple stacked bodies is selected by these switches.

For example, the controller 70 is electrically connected to one end portion (in the example, the first portion 20a) of the first layer 21. The controller 70 is electrically connected to another end portion (e.g., a portion 20x) of the first layer 21.

Third Embodiment

Figure 13A:
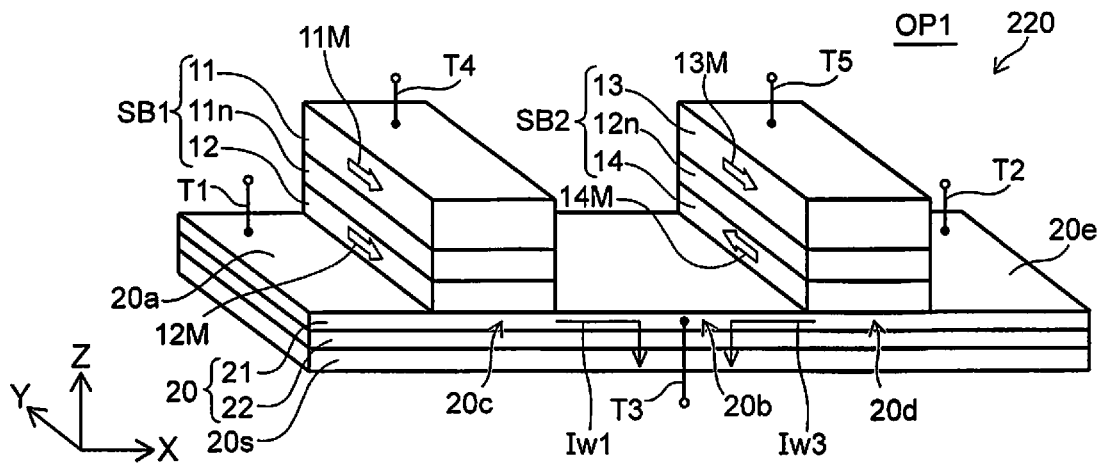
FIG. 13A to FIG. 13C are schematic perspective views illustrating a magnetic memory device according to a third embodiment.
Figure 13B:
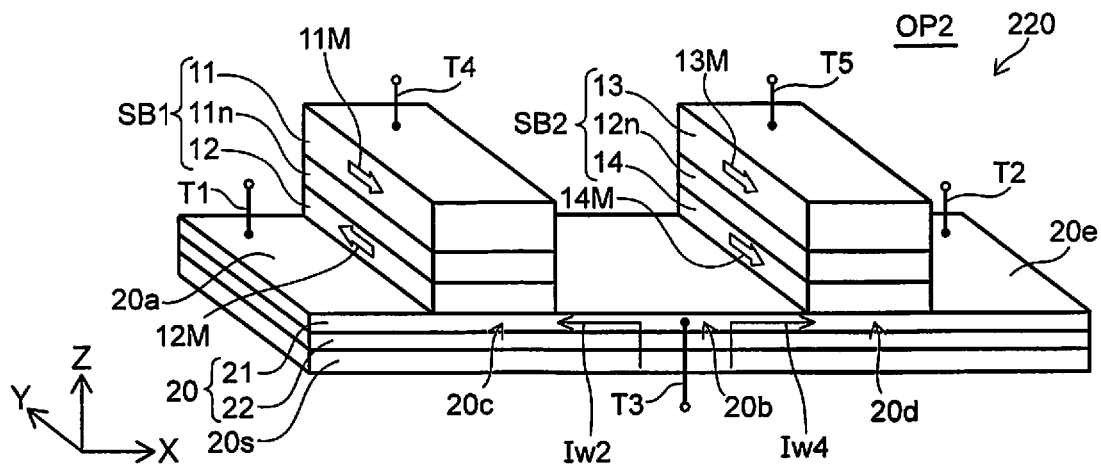
Figure 13C:
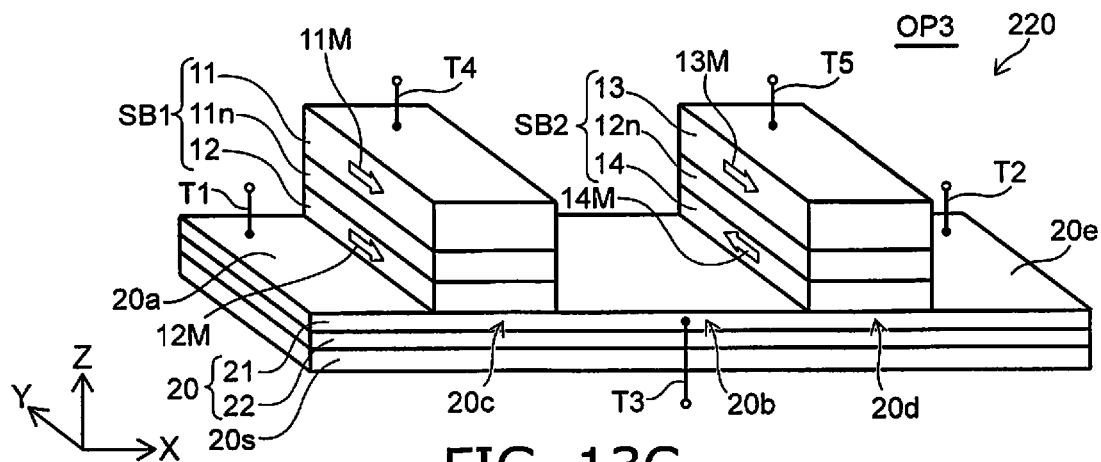

FIG. 13A to FIG. 13C are schematic perspective views illustrating a magnetic memory device according to a third embodiment.

As shown in FIG. 13A, multiple stacked bodies (the first stacked body SB1 and the second stacked body SB2) are provided in the magnetic memory device 220 according to the embodiment as well. In the magnetic memory device 220, the current that flows in the first stacked body SB1 and the current that flows in the second stacked body SB2 are separate. For example, the first layer 21 includes the first to fifth portions 20a to 20e. The second portion 20b is provided between the first portion 20a and the fifth portion 20e. The fourth portion 20d is provided between the second portion 20b and the fifth portion 20e. The second direction from the first portion 20a toward the second portion 20b crosses the first direction (the Z-axis direction). The direction from the third portion 20c toward the first magnetic layer 11 is aligned with the first direction (the Z-axis direction). The second magnetic layer 12 is provided between the third portion 20c and the first magnetic layer 11. The direction from the fourth portion 20d toward the third magnetic layer 13 is aligned with the first direction (the Z-axis direction). The fourth magnetic layer 14 is provided between the fourth portion 20d and the third magnetic layer 13.

The first stacked body SB1 overlaps the third portion 20c in the first direction (the Z-axis direction). The second stacked body SB2 overlaps the fourth portion 20d in the first direction. The second portion 20b of the first layer 21 corresponds to a portion between the first stacked body SB1 and the second stacked body SB2.

For example, a first terminal T1 is electrically connected to the first portion 20a of the first layer 21. A second terminal T2 is electrically connected to the fifth portion 20e. A third terminal T3 is electrically connected to the second portion 20b. A fourth terminal T4 is electrically connected to the first magnetic layer 11. A fifth terminal T5 is electrically connected to the third magnetic layer 13.

In one operation OP1 as shown in FIG. 13A, the first current Iw1 flows from the first terminal T1 toward the third terminal T3; and a third current Iw3 flows from the second terminal T2 toward the third terminal T3. The orientation of the current (the first current Iw1) at the position of the first stacked body SB1 is the reverse of the orientation of the current (the third current Iw3) at the position of the second stacked body SB2. In such an operation OP1, the orientation of the spin Hall torque acting on the second magnetic layer 12 of the first stacked body SB1 is the reverse of the orientation of the spin Hall torque acting on the fourth magnetic layer 14 of the second stacked body SB2.

In another operation OP2 shown in FIG. 13B, the second current Iw2 flows from the third terminal T3 toward the first terminal T1; and a fourth current Iw4 flows from the third terminal T3 toward the second terminal T2. The orientation of the current (the second current Iw2) at the position of the first stacked body SB1 is the reverse of the orientation of the current (the fourth current Iw4) at the position of the second stacked body SB2. In such an operation OP2, the orientation of the spin Hall torque acting on the second magnetic layer 12 of the first stacked body SB1 is the reverse of the orientation of the spin Hall torque acting on the fourth magnetic layer 14 of the second stacked body SB2.

As shown in FIG. 13A and FIG. 13B, the orientation of a fourth magnetization 14M of the fourth magnetic layer 14 is the reverse of the orientation of the second magnetization 12M of the second magnetic layer 12. On the other hand, the orientation of a third magnetization 13M of the third magnetic layer 13 is the same as the orientation of the first magnetization 11M of the first magnetic layer 11. Thus, magnetization information that has reverse orientations between the first stacked body SB1 and the second stacked body SB2 is stored. For example, the information (the data) in the case of the operation OP1 corresponds to "1." For example, the information (the data) in the case of the operation OP2 corresponds to "0." By such operations, for example, the reading can be faster as described below.

In the operation OP1 and the operation OP2, the second magnetization 12M of the second magnetic layer 12 and the spin current of the electrons (the polarized electrons) flowing through the first layer 21 have an interaction. The orientation of the second magnetization 12M and the orientation of the spin of the polarized electrons have a parallel or antiparallel relationship. The second magnetization 12M of the second magnetic layer 12 precesses and reverses. In the operation OP1 and the operation OP2, the orientation of the fourth magnetization 14M of the fourth magnetic layer 14 and the orientation of the spin of the polarized electrons have a parallel or antiparallel relationship. The fourth magnetization 14M of the fourth magnetic layer 14 precesses and reverses.

FIG. 13C illustrates a read operation of the magnetic memory device 220.

In a read operation OP3, the potential of the fourth terminal T4 is set to a fourth potential V4. The potential of the fifth terminal T5 is set to a fifth potential V5. The fourth potential V4 is, for example, a ground potential. The potential difference between the fourth potential V4 and the fifth potential V5 is taken as dV. Two electrical resistances are taken as a high resistance Rh and a low resistance Rl for each of the multiple stacked bodies. The high resistance Rh is higher than the low resistance Rl. For example, the resistance when the first magnetization 11M and the second magnetization 12M are antiparallel corresponds to the high resistance Rh. For example, the resistance when the first magnetization 11M and the second magnetization 12M are parallel corresponds to the low resistance Rl. For example, the resistance when the third magnetization 13M and the fourth magnetization 14M are antiparallel corresponds to the high resistance Rh. For example, the resistance when the third magnetization 13M and the fourth magnetization 14M are parallel corresponds to the low resistance Rl.

For example, in the operation OP1 (the "1" state) illustrated in FIG. 13A, a potential Vr1 of the third terminal T3 is represented by Formula (1).

$$Vr1 = \{Rl/(Rl+Rh)\} \times \Delta V \quad (1)$$

On the other hand, in the state of the operation OP2 (the "0" state) illustrated in FIG. 13B, a potential Vr2 of the third terminal T3 is represented by Formula (2).

$$Vr2 = \{Rh/(Rl+Rh)\} \times \Delta V \quad (2)$$

Accordingly, a potential change ΔVr between the "1" state and the "0" state is represented by Formula (3).

$$\Delta Vr = Vr2 - Vr1 = \{(Rh-Rl)/(Rl+Rh)\} \times \Delta V \quad (3)$$

The potential change ΔVr is obtained by measuring the potential of the third terminal T3.

Compared to the case where a constant current is supplied to the stacked body (the magnetoresistive element) and the voltage (the potential difference) between the two magnetic layers of the magnetoresistive element is measured, for example, the consumed energy when reading can be reduced in the read operation OP3 recited above. In the read operation OP3 recited above, for example, high-speed reading can be performed.

In the operation OP1 and the operation OP2 recited above, the perpendicular magnetic anisotropies of the second magnetic layer 12 and the fourth magnetic layer 14 can be controlled using the fourth terminal T4 and the fifth terminal T5. Thereby, the program current can be reduced. For example, the program current can be about ½ of the program current in the case where the programming is performed without using the fourth terminal T4 and the fifth terminal T5. For example, the program charge can be reduced. The relationship between the polarities of the voltages applied to the fourth terminal T4 and the fifth terminal T5 and the increase or decrease of the perpendicular magnetic anisotropy is dependent on the materials of the magnetic layers and the first layer 21.

Thus, the controller 70 is electrically connected to the first portion 20a, the second portion 20b, and the fifth portion 20e. The controller 70 performs a first program operation (the operation OP1) of supplying the first current Iw1 to the conductive member 20 (e.g., the first layer 21) and supplying the third current Iw3 to the conductive member 20 (e.g., the first layer 21). The first current Iw1 has the orientation from the first portion 20a toward the second portion 20b. The third current Iw3 has the orientation from the fifth portion 20e toward the second portion 20b.

The controller 70 performs a second program operation (the operation OP2) of supplying the second current Iw2 to the conductive member 20 (e.g., the first layer 21) and supplying the fourth current Iw4 to the conductive member 20 (e.g., the first layer 21). The second current Iw2 has the orientation from the second portion 20b toward the first portion 20a. The fourth current Iw4 has the orientation from the second portion 20b toward the fifth portion 20e.

The controller 70 also is electrically connected to the fourth terminal T4 (the first magnetic layer 11) and the fifth terminal T5 (the third magnetic layer 13). The controller 70 further performs the read operation (the operation OP3). In the read operation, the controller 70 applies a voltage between the first magnetic layer 11 and the third magnetic layer 13 and detects the potential of the second portion 20b.

Fourth Embodiment

Figure 14:
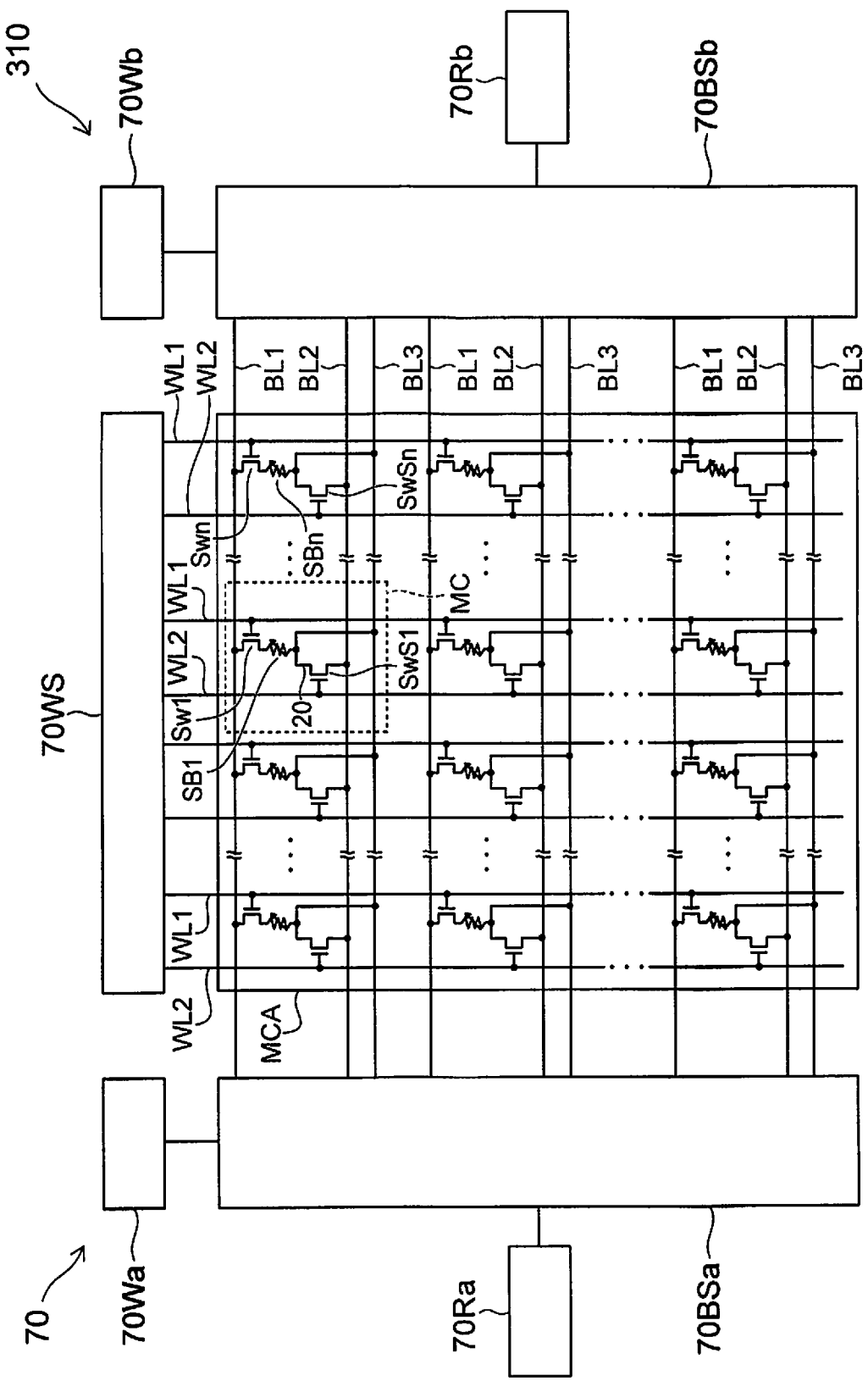
FIG. 14 is a schematic view showing a magnetic memory device according to a fourth embodiment.

FIG. 14 is a schematic view showing a magnetic memory device according to a fourth embodiment.

As shown in FIG. 14, a memory cell array MCA, multiple first interconnects (e.g., word lines WL1, WL2, etc.), multiple second interconnects (e.g., bit lines BL1, BL2, BL3, etc.), and the controller 70 are provided in the magnetic memory device 310 according to the embodiment. The multiple first interconnects extend in one direction. The multiple second interconnects extend in another one direction. The controller 70 includes a word line selection circuit 70WS, a first bit line selection circuit 70BSa, a second bit line selection circuit 70BSb, a first program circuit 70Wa, a second program circuit 70Wb, a first read circuit 70Ra, and a second read circuit 70Rb. Multiple memory cells MC are arranged in an array configuration in the memory cell array MCA.

For example, the switch Sw1 and the switch SwS1 are provided to correspond to one of the multiple memory cells MC. These switches are considered to be included in one of the multiple memory cells. These switches may be considered to be included in the controller 70. These switches are, for example, transistors. The one of the multiple memory cells MC includes, for example, a stacked body (e.g., the first stacked body SB1).

As described in reference to FIG. 12, multiple stacked bodies (the first stacked body SB1, the second stacked body SB2, the stacked body SBx, etc.) may be provided in one conductive member 20. Multiple switches (the switch Sw1, the switch Sw2, the switch Swx, etc.) may be provided respectively for the multiple stacked bodies. In FIG. 14, one stacked body (the stacked body SB1 or the like) and one switch (the switch Sw1 or the like) are drawn to correspond to one conductive member 20 for easier viewing of the drawing.

As shown in FIG. 14, one end of the first stacked body SB1 is connected to the conductive member 20. The other end of the first stacked body SB1 is connected to one of the source or the drain of the switch Sw1. The other of the source or the drain of the switch Sw1 is connected to the bit line BL1. The gate of the switch Sw1 is connected to the word line WL1. One end (e.g., the first portion 20a) of the conductive member 20 is connected to one of the source or the drain of the switch SwS1. The other end (e.g., the third portion 20e) of the conductive member 20 is connected to the bit line BL3. The other of the source or the drain of the switch SwS1 is connected to the bit line BL2. The gate of the switch SwS1 is connected to the word line WL2.

A stacked body SBn, a switch Swn, and a switch SwSn are provided for another one of the multiple memory cells MC.

An example of the program operation of the information to the memory cell MC will now be described.

The switch SwS1 of one memory cell MC (the selected memory cell) to which the programming is to be performed is set to the ON-state. For example, in the ON-state, the word line WL2 that is connected to the gate of one switch SwS1 is set to a high-level potential. The setting of the potential is performed by the word line selection circuit 70WS. The switch SwS1 of another memory cell MC (an unselected memory cell) of the column including the one memory cell MC (the selected memory cell) recited above also is set to the ON-state. In one example, the word line WL1 that is connected to the gate of the switch Sw1 inside the memory cell MC (the selected memory cell) and the word lines WL1 and WL2 that correspond to the other columns are set to a low-level potential.

Although one stacked body and one switch Sw1 that correspond to one conductive member 20 are drawn in FIG. 14, the multiple stacked bodies (the stacked body SB1, the second stacked body SB2, the stacked body SBx, etc.) and the multiple switches (the switch Sw1, the switch Sw2, the switch Swx, etc.) that correspond to one conductive member 20 are provided as described above. In such a case, for example, the switches that are connected respectively to the multiple stacked bodies are set to the ON-state. The select voltage is applied to one of the multiple stacked bodies. On the other hand, the unselect voltage is applied to the other stacked bodies. Programming is performed to the one of the multiple stacked bodies recited above; and the programming is not performed to the other stacked bodies. Selective programming of the multiple stacked bodies is performed.

The bit lines BL2 and BL3 that are connected to the memory cell MC (the selected cell) to which the programming is to be performed are selected. The selection is performed by the first bit line selection circuit 70BSa and the second bit line selection circuit 70BSb. The program current is supplied to the selected bit lines BL2 and BL3. The supply of the program current is performed by the first program circuit 70Wa and the second program circuit 70Wb. The program current flows from one of the first bit line selection circuit 70BSa or the second bit line selection circuit 70BSb toward the other of the first bit line selection circuit 70BSa or the second bit line selection circuit 70BSb. The magnetization direction of the memory layer (the second magnetic layer 12 or the like) of the MTJ element (the first stacked body SB1 or the like) is changeable by the program current. The magnetization direction of the memory layer of the MTJ element is changeable to the reverse direction of that recited above when the program current flows toward the one of the first bit line selection circuit 70BSa or the second bit line selection circuit 70BSb from the other of the first bit line selection circuit 70BSa or the second bit line selection circuit 70BSb. Thus, the programming is performed.

An example of the read operation of the information from the memory cell MC will now be described.

The word line WL1 that is connected to the memory cell MC (the selected cell) from which the reading is to be performed is set to the high-level potential. The switch Sw1 inside the memory cell MC (the selected cell) recited above is set to the ON-state. At this time, the switches Sw1 of the other memory cells MC (the unselected cells) of the column including the memory cell MC (the selected cell) recited above are set to the ON-state. The word line WL2 that is connected to the gate of the switch SwS1 inside the memory cell MC (the selected cell) recited above and the word lines WL1 and WL2 that correspond to the other columns are set to the low-level potential.

The bit lines BL1 and BL3 that are connected to the memory cell MC (the selected cell) from which the reading is to be performed are selected. The selection is performed by the first bit line selection circuit 70BSa and the second bit line selection circuit 70BSb. The read current is supplied to the selected bit line BL1 and bit line BL3. The supply of the read current is performed by the first read circuit 70Ra and the second read circuit 70Rb. The read current flows from one of the first bit line selection circuit 70BSa or the second bit line selection circuit 70BSb toward the other of the first bit line selection circuit 70BSa or the second bit line selection circuit 70BSb. For example, the voltage between the selected bit lines BL1 and BL3 recited above is detected by the first read circuit 70Ra and the second read circuit 70Rb. For example, the difference between the magnetization of the memory layer (the second magnetic layer 12) of the MTJ element and the magnetization of the reference layer (the first magnetic layer 11) of the MTJ element is detected. The difference includes the orientations of the magnetizations being in a mutually-parallel state (having the same orientation) or a mutually-antiparallel state (having the reverse orientation). Thus, the read operation is performed.

The embodiments may include the following configurations (e.g., technological proposals).

Configuration 1

A magnetic memory device, comprising:
a conductive member including a first layer including at least one selected from the group consisting of HfN having a NaCl structure, HfN having a fcc structure, and HfC having a NaCl structure;
a first magnetic layer separated from the first layer in a first direction;
a second magnetic layer provided between the first layer and the first magnetic layer; and
a first nonmagnetic layer provided between the first magnetic layer and the second magnetic layer.

Configuration 2

The magnetic memory device according to Configuration 1, further comprising a second layer,
the second magnetic layer being provided between the second layer and the first magnetic layer,
the first layer being provided between the second layer and the second magnetic layer,
the second layer including at least one selected from the group consisting of Nb, Mo, Ta, W, Eu, ZrN, $ZrC_{0.97}$, $NC_{0.99}$, and $TaC_{0.99}$ when the first layer includes the HfN having the NaCl structure.

Configuration 3

The magnetic memory device according to Configuration 1, further comprising a second layer,
the second magnetic layer being provided between the second layer and the first magnetic layer,
the first layer being provided between the second layer and the second magnetic layer,
the second layer including at least one selected from the group consisting of Eu, ZrN, $ZrC_{0.97}$, $NC_{0.99}$, and $TaC_{0.99}$ when the first layer includes the HfN having the NaCl structure.

Configuration 4

The magnetic memory device according to Configuration 1, further comprising a second layer,
the second magnetic layer being provided between the second layer and the first magnetic layer,
the first layer being provided between the second layer and the second magnetic layer,
the second layer including at least one selected from the group consisting of V, Mo, W, Eu, TiN, ZrN, TiC, NbN, $NC_{0.99}$, $TaC_{0.99}$, and MgO when the first layer includes the HfC having the NaCl structure.

Configuration 5

The magnetic memory device according to Configuration 1, further comprising a second layer,
the second magnetic layer being provided between the second layer and the first magnetic layer,
the first layer being provided between the second layer and the second magnetic layer,
the second layer including at least one selected from the group consisting of Eu, TiN, ZrN, TiC, NbN, $NC_{0.99}$, $TaC_{0.99}$, and MgO when the first layer includes the HfC having the NaCl structure.

Configuration 6

The magnetic memory device according to Configuration 1, further comprising a second layer,
the second magnetic layer being provided between the second layer and the first magnetic layer,
the first layer being provided between the second layer and the second magnetic layer,
the second layer including boron,
at least a portion of the second layer being amorphous.

Configuration 7

The magnetic memory device according to any one of Configurations 2 to 6, wherein the second layer contacts the first layer.

Configuration 8

The magnetic memory device according to any one of Configurations 2 to 6, wherein a ratio, to a first lattice constant of the first layer, of an absolute value of a difference between the first lattice constant and a second lattice constant of the second layer is 5% or less.

Configuration 9

The magnetic memory device according to any one of Configurations 1 to 8, wherein a <001> direction of at least a portion of the first layer is aligned with the first direction.

Configuration 10

The magnetic memory device according to any one of Configurations 1 to 8, wherein a <110> direction of at least a portion of the first layer is aligned with the first direction.

Configuration 11

The magnetic memory device according to any one of Configurations 1 to 10, further comprising a first member including Hf and a first element,
the first element including at least one selected from the group consisting of oxygen and nitrogen,
the first nonmagnetic layer having a side surface crossing a plane perpendicular to the first direction,
the first member opposing at least a portion of the side surface.

Configuration 12

The magnetic memory device according to any one of Configurations 1 to 11, further comprising a first member including Hf and carbon,
the first layer including the HfC,
the first nonmagnetic layer having a side surface crossing a plane perpendicular to the first direction,
the first member opposing at least a portion of the side surface.

Configuration 13

The magnetic memory device according to Configuration 11 or 12, wherein the first member further opposes the second magnetic layer in a direction along the perpendicular plane.

Configuration 14

The magnetic memory device according to any one of Configurations 1 to 10, further comprising:
a first member including Hf and a first element; and
a second member including Hf and a second element,
the first element including at least one selected from the group consisting of oxygen and nitrogen,
the second element including at least one selected from the group consisting of oxygen and nitrogen,
at least a portion of the first nonmagnetic layer being provided between the first member and the second member in a direction crossing the first direction.

Configuration 15

The magnetic memory device according to any one of Configurations 1 to 10, further comprising:
a first member including Hf and carbon; and a second member including Hf and carbon,
the first layer including the HfC,
at least a portion of the first nonmagnetic layer being provided between the first member and the second member in a direction crossing the first direction.

Configuration 16

The magnetic memory device according to Configuration 14 or 15, wherein the second magnetic layer is provided between the first member and the second member.

Configuration 17

The magnetic memory device according to any one of Configurations 1 to 16, wherein the first layer includes a non-overlap region and an overlap region, the non-overlap region not overlapping the second magnetic layer in the first direction, the overlap region overlapping the second magnetic layer in the first direction, a thickness along the first direction of the overlap region being thicker than a thickness along the first direction of the non-overlap region.

Configuration 18

The magnetic memory device according to any one of Configurations 1 to 17, wherein
the first layer includes a first portion, a second portion, and a third portion between the first portion and the second portion,
a second direction from the first portion toward the second portion crosses the first direction,
the first magnetic layer is separated from the third portion in the first direction,
the second magnetic layer is provided between the third portion and the first magnetic layer,
the first layer includes a plurality of grains,
the first layer has a first layer width along a third direction crossing a plane including the first direction and the second direction, and
a length along the third direction of at least one of the plurality of grains is $1/10$ of the first layer width or more.

Configuration 19

The magnetic memory device according to any one of Configurations 1 to 17, wherein
the first layer includes a first portion, a second portion, and a third portion between the first portion and the second portion,
a second direction from the first portion toward the second portion crosses the first direction,
the first magnetic layer is separated from the third portion in the first direction,
the second magnetic layer is provided between the third portion and the first magnetic layer,
the first layer includes a plurality of grains,
the second magnetic layer has a third-direction length along a third direction crossing a plane including the first direction and the second direction, and
a length along the third direction of at least one of the plurality of grains is $1/10$ of the third-direction length or more.

Configuration 20

The magnetic memory device according to any one of Configurations 1 to 17, wherein
the first layer includes a first portion, a second portion, and a third portion between the first portion and the second portion,
a second direction from the first portion toward the second portion crosses the first direction,
the first magnetic layer is separated from the third portion in the first direction,
the second magnetic layer is provided between the third portion and the first magnetic layer,
the first layer includes a plurality of grains,
the second magnetic layer has a second-direction length along the second direction, and
a length along the second direction of at least one of the plurality of grains is $1/10$ of the second-direction length or more.

Configuration 21

The magnetic memory device according to any one of Configurations 1 to 20, further comprising:
a third magnetic layer;
a fourth magnetic layer; and
a second nonmagnetic layer,
the conductive member including first to fifth portions, the second portion being provided between the first portion and the fifth portion, the fourth portion being provided between the second portion and the fifth portion,
a second direction from the first portion toward the second portion crossing the first direction,
a direction from the third portion toward the first magnetic layer being aligned with the first direction,
the second magnetic layer being provided between the third portion and the first magnetic layer,
a direction from the fourth portion toward the third magnetic layer being aligned with the first direction,
the fourth magnetic layer being provided between the fourth portion and the third magnetic layer.

Configuration 22

The magnetic memory device according to Configurations 1 to 21, further comprising a controller,
the conductive member including a first portion, a second portion, and a third portion between the first portion and the second portion,
a second direction from the first portion toward the second portion crossing the first direction,
the first magnetic layer being separated from the third portion in the first direction,
the second magnetic layer being provided between the third portion and the first magnetic layer,
the controller being electrically connected to the first portion and the second portion,
the controller being configured to perform
a first operation of supplying, to the conductive member, a first current from the first portion toward the second portion, and
a second operation of supplying, to the conductive member, a second current from the second portion toward the first portion.

Configuration 23

The magnetic memory device according to Configuration 22, wherein
the controller also is electrically connected to the first magnetic layer,
the controller further performs a third operation and a fourth operation,
in the first operation, the controller sets a potential difference between the first portion and the first magnetic layer to a first voltage,
in the second operation, the controller sets the potential difference between the first portion and the first magnetic layer to the first voltage,
in the third operation, the controller sets the potential difference between the first portion and the first magnetic layer to a second voltage and supplies the first current to the conductive member, in the fourth operation, the controller sets the potential difference between the first portion and the first magnetic layer to the second voltage and supplies the second current to the conductive member, the first voltage is different from the second voltage, a memory cell including the first magnetic layer, the first nonmagnetic layer, and the second magnetic layer is set to a first memory state by the first operation, the memory cell is set to a second memory state by the second operation, and the memory state of the memory cell substantially does not change before and after the third operation and substantially does not change before and after the fourth operation.

Configuration 24

The magnetic memory device according to Configurations 1 to 20, further comprising:
a third magnetic layer;
a fourth magnetic layer;
a second nonmagnetic layer; and
a controller,
the conductive member including first to fifth portions, the second portion being provided between the first portion and the fifth portion, the third portion being provided between the first portion and the second portion, the fourth portion being provided between the second portion and the fifth portion,
a second direction from the first portion toward the second portion crossing the first direction,
a direction from the third portion toward the first magnetic layer being aligned with the first direction,
the second magnetic layer being provided between the third portion and the first magnetic layer,
a direction from the fourth portion toward the third magnetic layer being aligned with the first direction,
the fourth magnetic layer being provided between the fourth portion and the third magnetic layer,
the controller being electrically connected to the first portion, the second portion, and the fifth portion,
the controller being configured to perform a first program operation of supplying, to the conductive member, a current having an orientation from the first portion toward the second portion and supplying, to the conductive member, a current having an orientation from the fifth portion toward the second portion.

Configuration 25

The magnetic memory device according to Configuration 24, wherein the controller performs a second program operation of supplying, to the conductive member, a current having an orientation from the second portion toward the first portion and supplying, to the conductive member, a current having an orientation from the second portion toward the fifth portion.

Configuration 26

The magnetic memory device according to Configuration 25, wherein the controller also is electrically connected to a first conductive layer and a third conductive layer, the controller further performs a read operation, and in the read operation, the controller applies a voltage between the first conductive layer and the third conductive layer and detects a potential of the second portion.

According to the embodiments, a magnetic memory device can be provided in which stable operations are possible.

In this specification, the notation of "first material/second material" means that the first material is positioned on the second material. For example, a layer of the first material is formed on a layer of the second material.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as magnetic layers, nonmagnetic layers, conductive members, first layers, second layers, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the Inventions. The accompanying claims and their equivalents are intended to cover such forms or modifications as would fall within the scope and spirit of the invention.

What is claimed is:

1. A magnetic memory device, comprising:
    a conductive member including a first layer including at least one selected from the group consisting of HfN having a NaCl structure, HfN having a fcc structure, and HfC having a NaCl structure;
    a first magnetic layer separated from the first layer in a first direction;
    a second magnetic layer provided between the first layer and the first magnetic layer;
    a first nonmagnetic layer provided between the first magnetic layer and the second magnetic layer;
    a second layer,
    the second magnetic layer being provided between the second layer and the first magnetic layer,
    the first layer being provided between the second layer and the second magnetic layer,
    the second layer including at least one selected from the group consisting of Nb, Mo, Ta, W, Eu, ZrN, $ZrC_{0.97}$, $NC_{0.99}$ and $TaC_{0.99}$ when the first layer includes the HfN having the NaCl structure.

2. The device according to claim 1, wherein the second layer contacts the first layer.

3. The device according to claim 1, wherein a ratio, to a first lattice constant of the first layer, of an absolute value of a difference between the first lattice constant and a second lattice constant of the second layer is 5% or less.

4. The device according to claim 1, wherein a <001> direction of at least a portion of the first layer is aligned with the first direction.

5. The device according to claim 1, wherein a <110> direction of at least a portion of the first layer is aligned with the first direction.

6. The device according to claim 1, further comprising a first member including Hf and a first element,
the first element including at least one selected from the group consisting of oxygen and nitrogen,
the first nonmagnetic layer having a side surface crossing a plane perpendicular to the first direction,
the first member opposing at least a portion of the side surface.

7. The device according to claim 6, wherein the first member further opposes the second magnetic layer in a direction along the perpendicular plane.

8. The device according to claim 1, further comprising a first member including Hf and carbon,
the first layer including the HfC,
the first nonmagnetic layer having a side surface crossing a plane perpendicular to the first direction,
the first member opposing at least a portion of the side surface.

9. The device according to claim 1, further comprising:
a first member including Hf and a first element; and
a second member including Hf and a second element,
the first element including at least one selected from the group consisting of oxygen and nitrogen,
the second element including at least one selected from the group consisting of oxygen and nitrogen,
at least a portion of the first nonmagnetic layer being provided between the first member and the second member in a direction crossing the first direction.

10. The device according to claim 9, wherein the second magnetic layer is provided between the first member and the second member.

11. The device according to claim 1, further comprising:
a first member including Hf and carbon; and
a second member including Hf and carbon,
the first layer including the HfC,
at least a portion of the first nonmagnetic layer being provided between the first member and the second member in a direction crossing the first direction.

12. The device according to claim 1, wherein the first layer includes a non-overlap region and an overlap region, the non-overlap region not overlapping the second magnetic layer in the first direction, the overlap region overlapping the second magnetic layer in the first direction, a thickness along the first direction of the overlap region being thicker than a thickness along the first direction of the non-overlap region.

13. The magnetic memory device according to claim 1, wherein
the first layer includes a first portion, a second portion, and a third portion between the first portion and the second portion,
a second direction from the first portion toward the second portion crosses the first direction,
the first magnetic layer is separated from the third portion in the first direction,
the second magnetic layer is provided between the third portion and the first magnetic layer,
the first layer includes a plurality of grains,
the first layer has a first layer width along a third direction crossing a plane including the first direction and the second direction, and
a length along the third direction of at least one of the plurality of grains is $\frac{1}{10}$ of the first layer width or more.

14. The magnetic memory device according to claim 1, wherein
the first layer includes a first portion, a second portion, and a third portion between the first portion and the second portion,
a second direction from the first portion toward the second portion crosses the first direction,
the first magnetic layer is separated from the third portion in the first direction,
the second magnetic layer is provided between the third portion and the first magnetic layer,
the first layer includes a plurality of grains,
the second magnetic layer has a third-direction length along a third direction crossing a plane including the first direction and the second direction, and
a length along the third direction of at least one of the plurality of grains is $\frac{1}{10}$ of the third-direction length or more.

15. The magnetic memory device according to claim 1, wherein
the first layer includes a first portion, a second portion, and a third portion between the first portion and the second portion,
a second direction from the first portion toward the second portion crosses the first direction,
the first magnetic layer is separated from the third portion in the first direction,
the second magnetic layer is provided between the third portion and the first magnetic layer,
the first layer includes a plurality of grains,
the second magnetic layer has a second-direction length along the second direction, and
a length along the second direction of at least one of the plurality of grains is $\frac{1}{10}$ of the second-direction length or more.

16. A magnetic memory device, comprising:
a conductive member including a first layer including at least one selected from the group consisting of HfN having a NaCl structure, HfN having a fcc structure, and HfC having a NaCl structure;
a first magnetic layer separated from the first layer in a first direction;
a second magnetic layer provided between the first layer and the first magnetic layer;
a first nonmagnetic layer provided between the first magnetic layer and the second magnetic layer; and
a second layer,
the second magnetic layer being provided between the second layer and the first magnetic layer,
the first layer being provided between the second layer and the second magnetic layer,
the second layer including at least one selected from the group consisting of Eu, ZrN, $ZrC_{0.97}$, $NC_{0.99}$, and $TaC_{0.99}$ when the first layer includes the HfN having the NaCl structure.

17. A magnetic memory device, comprising:
a conductive member including a first layer including at least one selected from the group consisting of HfN having a NaCl structure, HfN having a fcc structure, and HfC having a NaCl structure;
a first magnetic layer separated from the first layer in a first direction;

a second magnetic layer provided between the first layer and the first magnetic layer;
a first nonmagnetic layer provided between the first magnetic layer and the second magnetic layer; and
a second layer,
the second magnetic layer being provided between the second layer and the first magnetic layer,
the first layer being provided between the second layer and the second magnetic layer,
the second layer including at least one selected from the group consisting of V, Mo, W, Eu, TiN, ZrN, TiC, NbN, $NC_{0.99}$, $TaC_{0.99}$, and MgO when the first layer includes the HfC having the NaCl structure.

* * * * *